(12) United States Patent
Watanabe

(10) Patent No.: US 8,106,723 B2
(45) Date of Patent: Jan. 31, 2012

(54) RESONANT CIRCUIT, OSCILLATION CIRCUIT, FILTER CIRCUIT, AND ELECTRONIC DEVICE

(75) Inventor: Toru Watanabe, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 308 days.

(21) Appl. No.: 12/486,662

(22) Filed: Jun. 17, 2009

(65) Prior Publication Data

US 2009/0315645 A1 Dec. 24, 2009

(30) Foreign Application Priority Data

Jun. 18, 2008 (JP) ................................. 2008-158846
Mar. 25, 2009 (JP) ................................. 2009-073813

(51) Int. Cl.
  *H03H 9/125* (2006.01)
  *H03H 9/52* (2006.01)
  *H03H 3/013* (2006.01)

(52) U.S. Cl. ...... 333/186; 333/188; 333/200; 331/116 M

(58) Field of Classification Search .......... 333/186–189, 333/197–200; 331/116 R, 116 M
  See application file for complete search history.

(56) References Cited

U.S. PATENT DOCUMENTS

| | | | |
|---|---|---|---|
| 6,204,737 B1 * | 3/2001 | Ella | 333/187 |
| 6,249,073 B1 | 6/2001 | Nguyen et al. | |
| 6,424,074 B2 | 7/2002 | Nguyen | |
| 6,621,134 B1 * | 9/2003 | Zurn | 257/415 |
| 7,135,940 B2 * | 11/2006 | Kawakubo et al. | 333/17.1 |
| 7,211,926 B2 * | 5/2007 | Quevy et a | 310/315 |
| 7,215,061 B2 | 5/2007 | Kihara et al. | |
| 7,429,904 B2 * | 9/2008 | Trutna et al. | 333/187 |
| 7,490,390 B2 * | 2/2009 | Kawakubo et al. | 29/25.35 |
| 7,504,909 B2 | 3/2009 | Tada | |
| 7,696,587 B2 * | 4/2010 | Watanabe et al. | 257/415 |
| 7,923,790 B1 * | 4/2011 | Quevy et al. | 257/415 |
| 2005/0245011 A1 | 11/2005 | Tada et al. | |
| 2008/0204153 A1 * | 8/2008 | Yoshida et al. | 331/66 |

FOREIGN PATENT DOCUMENTS

| | | |
|---|---|---|
| JP | 2004-058228 A | 2/2004 |
| JP | 2005-271191 A | 10/2004 |
| JP | 2007-142533 A | 6/2007 |
| WO | WO 2005/004326 A1 | 1/2005 |

* cited by examiner

*Primary Examiner* — Barbara Summons
(74) *Attorney, Agent, or Firm* — Kilpatrick Townsend & Stockton LLP

(57) ABSTRACT

A resonant circuit includes a substrate; a MEMS resonator including a fixed electrode and a movable electrode formed above the substrate and having a first terminal and a second terminal, the movable electrode having a movable portion opposing at least a part of the fixed electrode; a first input-output terminal connected to the first terminal connected to one of the fixed electrode and the movable electrode of the MEMS resonator; a second input-output terminal connected to the second terminal connected to an other one of the fixed electrode and the movable electrode of the MEMS resonator; a voltage applying unit supplying a potential to at least the first terminal to apply a bias voltage between the first and the second terminals; and a variable capacitance connected between the first terminal and the first input-output terminal to allow a capacitance value to be changed by a change in a potential difference between opposite ends of the variable capacitance.

12 Claims, 9 Drawing Sheets

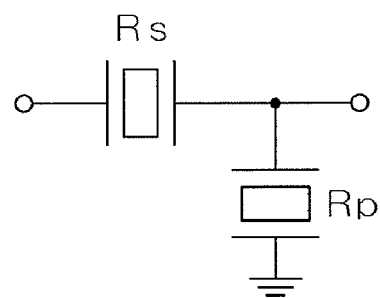
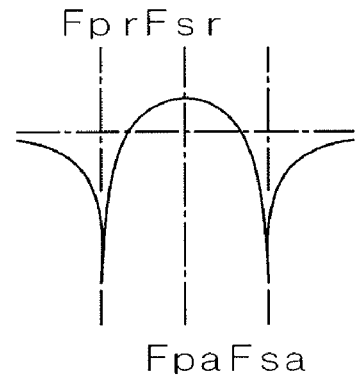
FIG.12A-1                FIG.12A-2
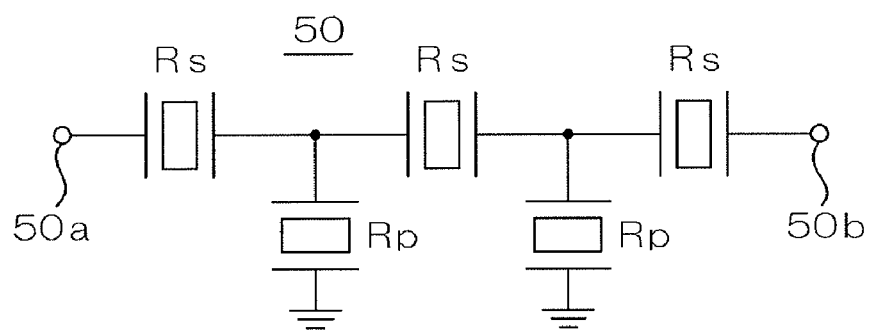
FIG.12B

RESONANT CIRCUIT, OSCILLATION CIRCUIT, FILTER CIRCUIT, AND ELECTRONIC DEVICE

BACKGROUND

1. Technical Field

The present invention relates to a resonant circuit, an oscillation circuit, a filter circuit, and an electronic device. Particularly, the invention relates to a structure of the resonant circuit using a MEMS resonator.

2. Related Art

In the recent electronic device market, products using MEMS (micro electro-mechanical system) technology are becoming increasingly popular. The MEMS products are electro-mechanical devices (MEMS devices) having a micro structure (a MEMS structure) formed on a substrate by using a semiconductor-manufacturing technology. Specific examples of the devices using the MEMS technology include micro sensors such as acceleration sensors, angular velocity sensors, inertial sensors, and pressure sensors. Market demands for the sensors are rapidly growing these days. Thus, the MEMS technology has great potential in creating new devices. In the future, a variety of practical applications of the MEMS devices, alone or in combinations, are expected to be sequentially achieved by utilizing characteristics of micro structures such as micro mechanical relays (switches) and variable capacitance elements.

A new practical example of the MEMS technology is a resonator, which is also called vibrator, oscillator, resonator element, resonator device, or the like, and referred to as "MEMS resonator" in the present specification. The MEMS resonator is typically operated by an electrostatic driving and sensing system or a piezoelectric driving and sensing system. Particularly, the former system is highly consistent with a semiconductor process such as a CMOS process and thus can be regarded as an effective system for miniaturization and cost reduction. In the electrostatic driving and sensing system, there is formed a MEMS resonator with a movable electrode and a fixed electrode to sense electrostatic force-induced vibration of the movable electrode by a change in capacitance between the movable electrode and the fixed electrode. FIGS. 3A and 3B show common examples of transmission characteristics and phase characteristics of such a MEMS resonator. Examples of the resonant circuit shown in the drawings are disclosed in U.S. Pat. No. 6,249,073, U.S. Pat. No. 6,424,074, and JP-A-2004-58228.

In the MEMS resonator as above, usually, a direct current bias voltage is applied between the movable electrode and the fixed electrode of the resonator. Application of the direct current bias voltage facilitates vibration of the resonator, improving resonant characteristics. In this case, the bias voltage needs to be set with a predetermined margin to prevent occurrence of a pull-in phenomenon in which the movable electrode contacts with the fixed electrode due to electrostatic attraction generated between the electrodes of the resonator. Under the circumstances, in order to improve the resonant characteristics of the MEMS resonator, usually, it is desirable to increase the bias voltage while maintaining the margin. However, resonance frequency of the resonator is changed depending on a value of the bias voltage. In other words, a change in the applied bias voltage due to an external factor causes a shift in the resonance frequency of the MEMS resonator. Accordingly, oscillation circuits or filter circuits including a resonant circuit with the MEMS resonator cannot produce a desired oscillation frequency or desired filter characteristics because of the bias voltage change.

Specifically, since the resonance frequency of the MEMS resonator depends on the bias voltage, the bias voltage needs to be set in consideration of the resonance frequency in order to control a changing mode of the resonance frequency. This makes it difficult to use the MEMS resonator in various circuit structures.

SUMMARY

The present invention has been accomplished to solve the above problems. An advantage of the invention is to provide a resonant circuit that can control resonance frequency change in a MEMS resonator due to a change in a bias voltage. Another advantage of the invention is to provide an oscillation circuit, a filter circuit, and an electronic device each including the resonant circuit.

In view of the circumstances, a resonant circuit according to a first aspect of the invention includes a substrate; a MEMS resonator including a fixed electrode and a movable electrode formed above the substrate and having a first terminal and a second terminal, the movable electrode having a movable portion opposing at least a part of the fixed electrode; a first input-output terminal connected to the first terminal connected to one of the fixed electrode and the movable electrode of the MEMS resonator; a second input-output terminal connected to the second terminal connected to an other one of the fixed electrode and the movable electrode of the MEMS resonator; a voltage applying unit supplying a potential to at least the first terminal to apply a bias voltage between the first and the second terminals; and a variable capacitance connected between the first terminal and the first input-output terminal to allow a capacitance value to be changed by a change in a potential difference between opposite ends of the variable capacitance.

In the resonant circuit, for example, as shown in FIG. 15A, resonance operation with a predetermined resonance frequency can be caused by allowing a voltage applying unit 20 to apply a bias voltage Vc between a first terminal 10a and a second terminal 10b of a MEMS resonator 10 and apply an alternating current voltage to the first terminal 10a or the second terminal 10b. Additionally, a capacitance value of a variable capacitance Cc1 is changed by a potential difference between opposite ends of the variable capacitance Cc1 by connecting one of the opposite ends thereof to a first input-output terminal 30a connected to the first terminal 10a receiving a potential from the voltage applying unit 20. In this arrangement, the potential difference between the opposite ends of the variable capacitance Cc1 changes with change in the potential of the first terminal 10a supplied by the voltage applying unit 20. Accordingly, characteristics in the change in the capacitance value of the variable capacitance Cc1 can be utilized to change a state of change in the resonance frequency of the MEMS resonator 10 caused by change in the bias voltage Vc applied to the MEMS resonator 10. Therefore, changing characteristics of the resonance frequency depending on the bias voltage enables a resonance frequency value and a range of resonance frequency change to be arbitrarily designed.

In the resonant circuit, preferably, the variable capacitance is characterized by at least partially having a voltage-dependent region where the change in the potential difference between the opposite ends of the variable capacitance causes the capacitance value to change monotonously and an increase in the bias voltage causes the capacitance value to be reduced monotonously. Naturally, an increase in bias voltage acts to reduce a resonance frequency. However, in the resonant circuit, due to the increase in the bias voltage, the capacitance value of the variable capacitance is reduced, which acts to increase the resonance frequency. This can provide an automatic stabilization effect of the variable capacitance on the resonance frequency. Thus, resonance frequency change due to bias voltage change can be suppressed, thereby achieving stabilization of the resonance frequency.

Preferably, in the resonant circuit, the voltage applying unit supplies a first potential to the first terminal, whereas the second terminal is set at a grounded potential. In the resonant circuit, while the voltage applying unit supplies the first potential to the first terminal, the second terminal has a fixed potential value. Thereby, when the potential applied to the first terminal changes, the potential difference applied to the MEMS resonator, namely, the bias voltage applied to the resonator is also changed. At the same time, when a potential applied to the other one of the opposite ends of the coupling capacitance has a fixed value, the potential difference between the opposite ends thereof also changes in conjunction with the bias voltage, whereby the value of the coupling capacitance is reduced. Accordingly, the changing state of the resonance frequency in the MEMS resonator can be changed by using the change in the capacitance value of the coupling capacitance.

Preferably, in the resonant circuit, the voltage applying unit supplies a first potential and a second potential, respectively, to the first terminal and the second terminal, respectively. In the resonant circuit, as shown in FIG. 15B, a voltage applying unit 20' supplies a first potential Vp and a second potential Vq, respectively, to the first terminal 10a and the second terminal 10b, respectively, of the MEMS resonator 10. This can ensure supply of the bias voltage Vc to the MEMS resonator 10. In addition, although the voltage applying unit 20' supplies the first potential Vp as a variable potential to the first terminal 10a, the potential Vq of the second terminal 10b is set to a fixed value. Thus, when the potential Vp applied to the first terminal 10a changes, the potential difference applied to the MEMS resonator 10, namely, the bias voltage Vc of the resonator also changes. Simultaneously, when a potential applied to the other one of the opposite ends of the variable capacitance Cc1 has a fixed value, the potential difference between the opposite ends thereof also changes in conjunction with the bias voltage Vc, causing the capacitance value of the variable capacitance Cc1 to change. Accordingly, the changing state of the resonance frequency in the MEMS resonator 10 can be changed by using the change in the capacitance value of the variable capacitance.

Preferably, the resonant circuit further includes an additional capacitance connected in parallel to the variable capacitance. In the resonant circuit, connecting the variable capacitance in parallel to the additional capacitance surely allows the capacitance value of and variable characteristics of the variable capacitance to be consistent with resonance characteristics of the resonator, while maintaining the capacitance value necessary to serve as a coupling capacitance. Accordingly, resonance frequency change can be further reduced, as well as each part of the circuit can be more suitably designed.

A resonant circuit according to a second aspect of the invention includes a substrate; a MEMS resonator including a fixed electrode and a movable electrode formed above the substrate and having a first terminal and a second terminal, the movable electrode having a movable portion opposing at least a part of the fixed electrode; a first input-output terminal connected to the first terminal connected to one of the fixed electrode and the movable electrode of the MEMS resonator; a second input-output terminal connected to the second terminal connected to an other one of the fixed electrode and the movable electrode of the MEMS resonator; a voltage applying unit supplying a potential to the first terminal to apply a bias voltage between the first and the second terminals, the bias voltage increasing as the potential supplied to the first terminal is increased; and a variable capacitance connected between the first terminal and the first input-output terminal to allow a capacitance value to be reduced by an increase in the potential supplied to the first terminal. In addition, in the resonator circuit of the second aspect, the bias voltage may be reduced as the potential supplied to the first terminal by the voltage applying unit is increased. Additionally, regardless of increase or reduction in the bias voltage in accordance with the increase in the potential supplied to the first terminal, the capacitance value of the variable capacitance may be increased.

Next, as an electronic circuit according to a third aspect of the invention, there is provided an oscillation circuit including the resonant circuit of the first aspect and an external circuit having an amplifier circuit connected to the resonant circuit. In the oscillation circuit, the external circuit may be connected to the first and the second input-output terminals. In addition, as an electronic circuit according to a fourth aspect of the invention, there is provided a filter circuit including the resonant circuit of the first aspect. In the filter circuit, the resonant circuit may be connected in series between the an input terminal and an output terminal of the filter circuit, as well as the resonant circuit may be connected also between each of the input-output terminals of the resonant circuit and a constant (grounded) potential terminal between input and output terminals of the filter circuit. Furthermore, an electronic device according to a fifth aspect of the invention includes the resonant circuit of the first aspect.

In addition, in the resonant circuit of the first aspect, preferably, the MEMS resonator, the voltage applying unit, and the variable capacitance are provided above the same substrate. Additionally, in the oscillation circuit of the third aspect, preferably, the MEMS resonator, the voltage applying unit, the variable capacitance, and the amplifier circuit are provided above the same substrate. Furthermore, in the filter circuit of the fourth aspect, preferably, the MEMS resonator, the voltage applying unit, and the variable capacitance are provided above the same substrate. Still furthermore, in the electronic device of the fifth aspect, preferably, the oscillation circuit and the filter circuit are provided above the same substrate.

The substrate used for each of the resonant circuit, the electronic circuit, and the electronic device may be a semiconductor substrate made of silicon or the like, a glass substrate, a ceramic substrate, or the like. In order to form the MEMS resonator, a silicon substrate or any one of other semiconductor substrates is preferably used, thereby obtaining a semiconductor device.

In addition, preferably, in the resonant circuit, the variable capacitance includes a pair of capacitance electrodes and at least one of the capacitance electrodes is made of a same material as that of at least one of the fixed electrode and the movable electrode. This can suppress an increase of step in a production process due to formation of the variable capacitance.

In this case, the variable capacitance may be a metal-insulator-semiconductor (MIS) capacitance. Thereby, when forming a signal circuit by an integrated circuit technology, the variable capacitance can be formed readily and efficiently. In addition, the MIS capacitance is preferably a metal-oxide-semiconductor (MOS) capacitance, and more preferably a metal-oxide-semiconductor field-effect transistor (MOSFET). The MOSFET is an electronic element used in an amplifier circuit in a complementary metal-oxide semiconductor (CMOS) device or the like. Thus, forming the MOS capacitance by using the MOSFET allows the variable capacitance to be formed more readily and efficiently.

In addition, preferably, in the resonant circuit, the variable capacitance operates within a value range of 1/10 to 10 times larger than an equivalent series capacitance of the MEMS resonator. The equivalent series capacitance indicates a capacitance value of a series resonance section in an electrically equivalent circuit of the MEMS resonator. In general, it is difficult to freely set capacitance characteristics of a variable capacitance. However, when the value of the variable capacitance is within the range of 1/10 to 10 times the equivalent series capacitance of the MEMS resonator (a capacitance component changing in accordance with the bias voltage), orders of capacitance values of both capacitances are approximately the same. Consequently, the capacitance characteristics of the variable capacitance increase suppression effect on resonance frequency change.

Furthermore, preferably, in the resonant circuit, the equivalent series capacitance of the MEMS resonator falls within a range of $1.0 \times 10^{-11}$ to $10^{-13}$ [F]. Since the value of the equivalent series capacitance of the MEMS resonator falling within the above range has approximately a same order as that of a capacitance value of a commonly-used coupling capacitance. Accordingly, the variable capacitance can serve as a coupling capacitance, as well as resonance frequency change can be suppressed.

As described hereinabove, the aspects and the features of the invention allow control of the changing state of the resonance frequency in the MEMS resonator. Therefore, the invention provides an excellent advantageous effect that enables the resonant circuit to be designed in accordance with required characteristics of the resonance frequency.

BRIEF DESCRIPTION OF THE DRAWINGS

The invention will be described with reference to the accompanying drawings, wherein like numbers reference like elements.

FIGS. 12A-1 and 12A-2 are a basic structure of a ladder-type filter circuit and frequency band characteristics of the filter circuit.

FIG. 12B is a circuit diagram showing a structure of the filter circuit as an electronic circuit of Example 4.

DESCRIPTION OF EXEMPLARY EMBODIMENTS

Figure 1:
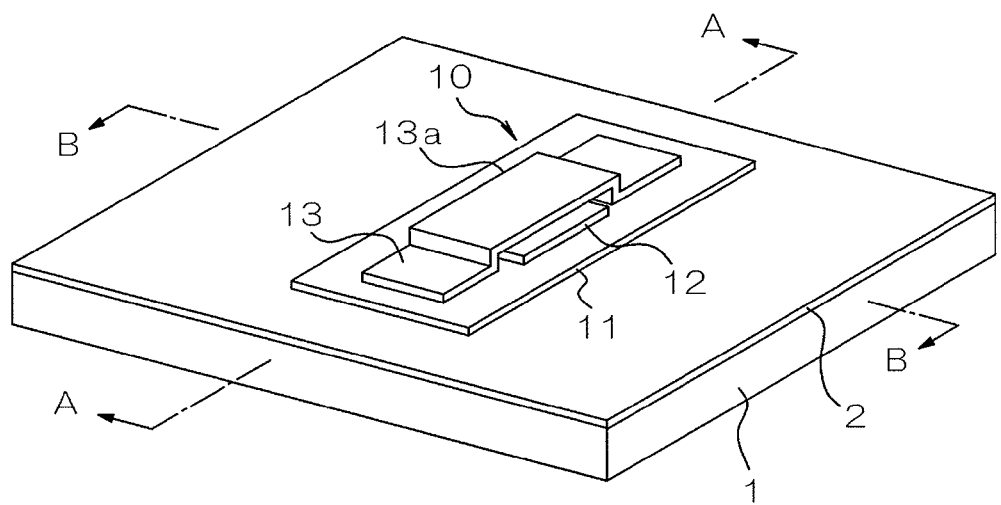
FIG. 1 is a schematic perspective view showing a structural example of a MEMS resonator included in a resonant circuit according to an embodiment of the invention.
Figures 2A, 2B:
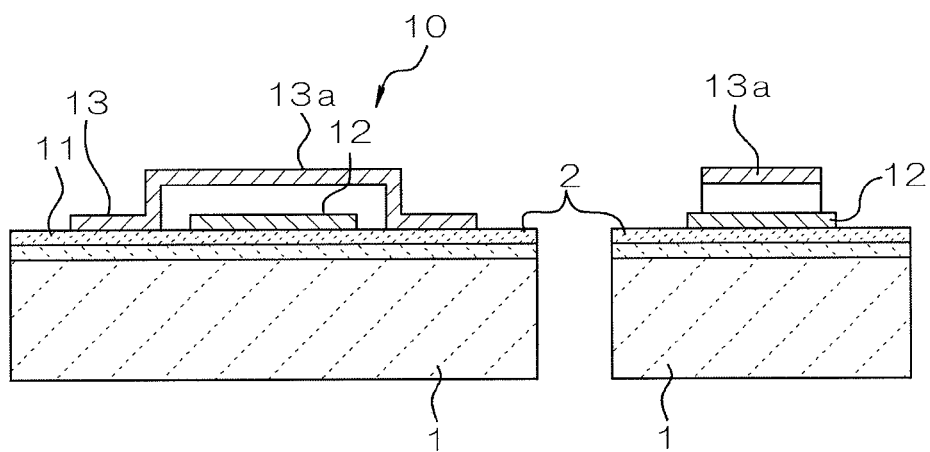
FIGS. 2A and 2B are longitudinal sectional views of the MEMS resonator.

Embodiments of the invention will be described in detail with reference to the accompanying drawings. FIG. 1 is a schematic perspective view showing a structural example of a MEMS resonator according to an embodiment of the invention; and FIGS. 2A and 2B are sectional views of the resonator 10 showing sections taken along lines A-A and B-B in FIG. 1.

The MEMS resonator 10 is formed above a substrate 1 such as a semiconductor substrate made of monocrystalline silicon or the like. First, on the substrate 1 is formed an insulating film 2 made of silicon oxide ($SiO_2$) or the like, and then, on the insulating film 2 is formed a base layer 11 made of silicon nitride or the like. On the base layer 11 are formed a fixed electrode 12 made of polycrystalline silicon or the like having conductivity provided by doping and a movable electrode 13 made of the same material. In the MEMS resonator 10, an opposing portion 12a of the fixed electrode 12 and a movable portion 13a of the movable electrode 13 serve as a pair of resonator electrodes of the resonator. The opposing portion 12a and the movable portion 13a are opposed to each other in a vertical direction relative to each other at a predetermined distance above the substrate 1. Then, the movable portion 13a is configured to bend in response to electrostatic attraction generated between the movable portion 13a and the opposing portion 12a so as to be movable in a direction changing the distance between the portions 13a and 12a opposing to each other.

In order to form the fixed electrode 12 and the movable electrode 13, first, on the base layer 11 is formed a first layer made of a conductive material such as the polycrystalline silicon or the like by using chemical vapor deposition (CVD) or the like. The fixed electrode 12 is formed by patterning of the first layer. Next, a sacrificial layer (not shown) made of $SiO_2$ or the like having a predetermined thickness is formed on a surface of the fixed electrode 12. After that, on the sacrificial layer is formed a second layer made of the conductive material such as the polycrystalline silicon. The formed second layer is patterned in such a manner that a part of a structure of the second layer is fixed onto the base layer 11, so as to form the movable electrode 13. Lastly, the sacrificial layer is removed by an etching liquid or gas, such as buffered hydrofluoric acid, whereby an upper part of the movable electrode 13 as the movable portion 13a is separated from a region on the substrate 1 to be supported at base parts thereof.

Consequently, the movable electrode 13 is formed like an opposite-end supporting beam overhanging the fixed electrode 12.

The MEMS resonator 10 shown in the drawings has the opposite-end supporting beam structure in which one of the pair of resonator electrodes has a shape of the opposite-end supporting beam to form the movable portion 13a. However, this is merely an example of the resonator according to the embodiment. The MEMS resonator 10 may be formed so as to have any of various shapes and structures, such as a cantilevered or disc-shaped structure.

Figure 3A:
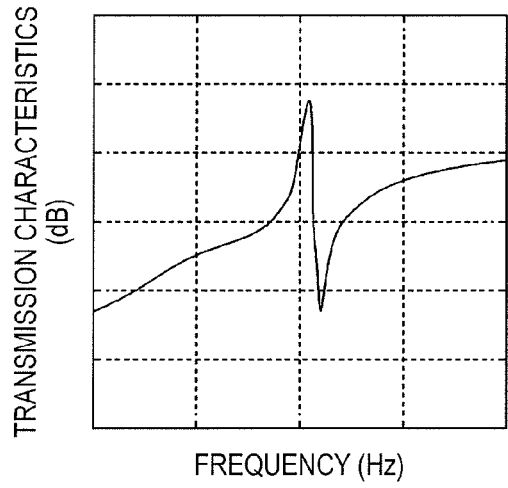
FIGS. 3A and 3B are graphs showing a frequency dependence of transmission characteristics and a phase shift in the MEMS resonator.
Figure 3B:
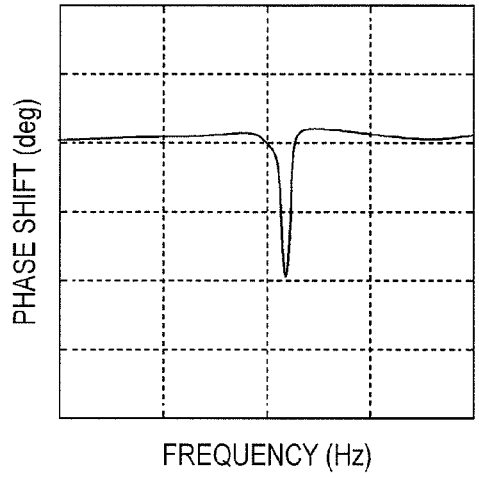

FIGS. 3A and 3B are schematic characteristic graphs showing electrical characteristics of the MEMS resonator 10 of the embodiment. FIG. 3A shows transmission characteristics obtained when an alternating current (AC) signal is input to the MEMS resonator 10; and FIG. 3B shows a phase shift. As shown in the drawings, the MEMS resonator 1—has resonance characteristics having a predetermined resonance frequency $f_n$, which is obtained by a following formula (1):

$$f_n = (1/2\pi) \times (K_m/m_{eff})^{1/2} \quad (1)$$

In the formula (1), $K_m$ represents a spring constant determined by the structure of the resonator 10 and $m_{eff}$ represents an effective mass of the structure of the resonator 10.

When an appropriately predetermined bias voltage (a direct current (DC) bias voltage) is applied between the fixed electrode 12 and the movable electrode 13 of the MEMS resonator 10, electrostatic attraction is generated between the electrodes 12 and 13. The electrostatic attraction acts so as to reduce the spring constant $K_m$, thereby reducing the resonance frequency $f_n$ obtained by the formula (1). In general, the resonance frequency $f_n$ is further reduced as the bias voltage is increased.

Figure 4:
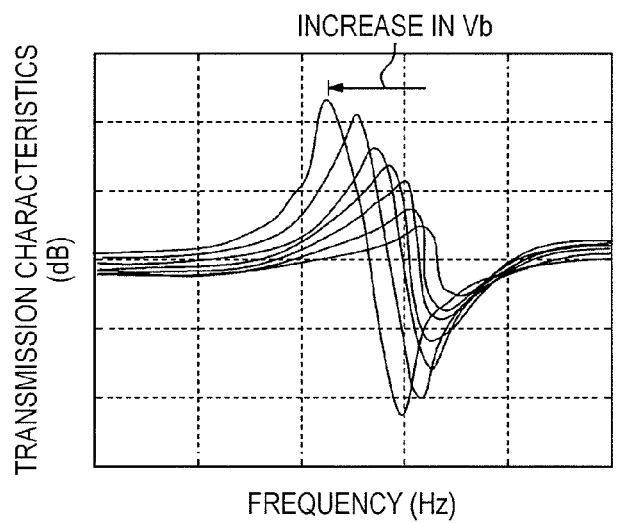
FIG. 4 is a graph showing a bias voltage dependence of the MEMS resonator.

FIG. 4 is a graph showing resonance characteristics of the AC signal obtained by changing a bias voltage Vb applied to the MEMS resonator 10. As shown in the graph, as the bias voltage Vb is increased, the resonance frequency $f_n$ is reduced.

Figure 5:
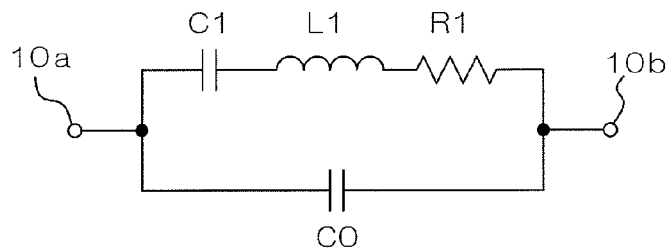
FIG. 5 is an equivalent circuit diagram of the MEMS resonator.

FIG. 5 is an equivalent circuit diagram of the MEMS resonator 10. The MEMS resonator 10 is shown by an equivalent circuit in which a series circuit including an equivalent series capacitance C1, an equivalent series inductance L1, and an equivalent series resistance R1 is connected in parallel to an equivalent parallel capacitance C0. The series resonance frequency $f_n$ is obtained as below by using a constant of the equivalent circuit.

$$f_n = (1/2\pi) \times (L1 \times C1)^{-1/2} \quad (1')$$

In this case, the equivalent series capacitance C1 is obtained by a following formula (2):

$$C1 = \eta^2/K_m \quad (2)$$

In the formula (2), $\eta$ represents an electro-mechanical energy conversion coefficient (efficiency in which displacement energy generated by vibration is converted to electric energy). When a change in the bias voltage reduces the spring constant $K_m$ of the MEMS resonator 10, the equivalent series capacitance C1 is increased. Thereby, the formula (1') shows resonance frequency reduction.

Figure 6A:
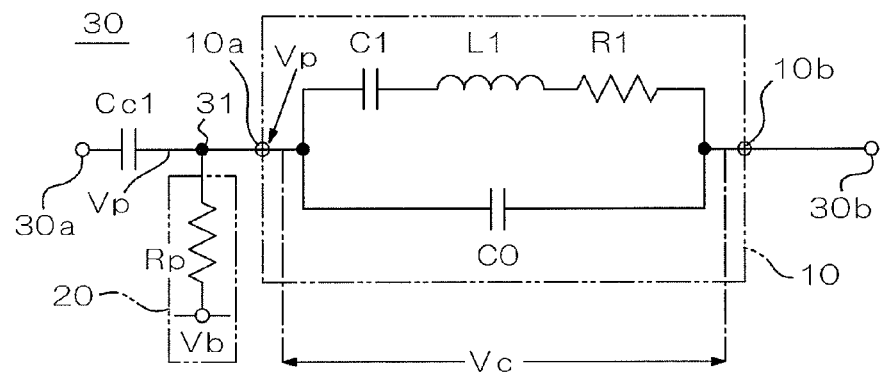
FIG. 6A is a circuit diagram of a resonant circuit according to a first embodiment of the invention.

FIG. 6A shows a structural example of a resonant circuit according to a first embodiment of the invention. A resonant circuit 30 of the first embodiment in FIG. 6A includes the MEMS resonator 10, a first input-output terminal 30a provided at a first terminal 10a of the MEMS resonator 10, a second input-output terminal 30b provided at a second terminal 10b of the resonator 10, a coupling capacitance Cc1 connected between the first terminal 10a of the resonator 10 and the first input-output terminal 30a of the resonant circuit, and a voltage applying unit 20 connected to a terminal 31 provided between the first terminal 10a of the resonator 10 and the coupling capacitance Cc1.

The voltage applying unit 20 includes a voltage source having a potential Vb and a resistance Rp in the example shown in FIG. 6A. The terminal 31 is at a DC potential Vp having a same value as that of an externally applied voltage Vb in the voltage applying unit 20. This is because the resonator 10 acts galvanically as a capacitance element and the coupling capacitance Cc1 is present between the resonator 10 and an external circuit connected to the first input-output terminal 30a of the resonant circuit 30.

The coupling capacitance Cc1 includes a voltage-dependent variable capacitance having a capacitance value changed by a difference of potentials (a voltage) applied to opposite ends of the capacitance Cc1. In the present embodiment, the capacitance Cc1 as a variable capacitance is also referred to as the coupling capacitance, since the Cc1 serves also as a coupling capacitance when the resonant circuit 30 is connected to the external circuit. However, the variable capacitance Cc1 is not specifically restricted to that.

Figure 6B:
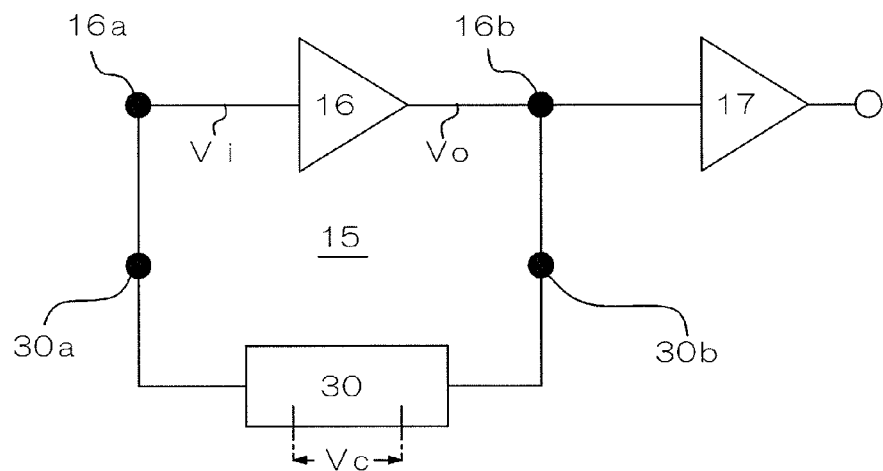
FIG. 6B is a diagram showing a structural example of an oscillation circuit.

FIG. 6B shows a structural example of an oscillation circuit 15 formed by connecting the resonant circuit 30 to other circuits. The oscillation circuit 15 includes the resonant circuit 30, an amplifier circuit 16, and an output buffer 17. In the amplifier circuit 16, a DC potential Vi of an input terminal 16a and a DC potential Vo of an output terminal 16b are each determined by a bias voltage of an active circuit element or the like to be set to a predetermined value. In FIG. 6B, the first input-output terminal 30a of the resonant circuit 30 is at the same potential as the potential Vi of the input terminal 16a of the amplifier circuit 16, and the second input-output terminal 30b of the resonator circuit 30 is at the same potential as the potential Vo of the output terminal 16b of the amplifier circuit 16. Additionally, as shown in FIG. 6A, the first terminal 10a of the MEMS resonator 10 receives the DC potential Vp applied by the voltage applying unit 20.

As a result, a potential difference between the first and the second terminals of the MEMS resonator 10 is equivalent to a difference value between the DC potential Vp and the potential Vo of the terminal 30b. The difference value is of a bias voltage Vc of the MEMS resonator 10. Meanwhile, a potential difference between opposite ends of the coupling capacitance Cc1 as the variable capacitance is equivalent to a difference value between the potential Vp and the potential Vi of the terminal 30b, and the difference value is of a bias voltage of the coupling capacitance Cc1.

The first embodiment includes the coupling capacitance Cc1. Then, the resonance frequency $f_n$, which is different from that in the formula (1'), is calculated by a following formula (3):

$$f_n = (1/2\pi) \times (L1 \times C1)^{-1/2} \times \{1 + C1/(C0 + Cc1)\}^{1/2} \quad (3)$$

The formula (3) shows that the coupling capacitance Cc1 is among elements for determining the resonance frequency and the resonance frequency can be controlled by changing the value of the Cc1.

In the embodiment, as described above, the coupling capacitance Cc1 is the voltage-dependent variable capacitance, and the capacitance value of the Cc1 is controlled in accordance with the potential Vp applied to one of the terminals of the MEMS resonator 10. The coupling capacitance Cc1 has the characteristic in which the capacitance value of the Cc1 is reduced as the potential Vp is increased.

The mechanical spring constant $K_m$ of the resonator 10 is reduced as the bias voltage Vc is increased, as described above, so that the equivalent series capacitance C1 is increased as shown in the formula (2). When this is applied to the formula (3), the increase of the capacitance C1 reduces the resonance frequency $f_n$, whereas simultaneously reducing the value of the coupling capacitance Cc1 can suppress an amount of shift in the resonance frequency $f_n$.

Figures 8A, 8B:
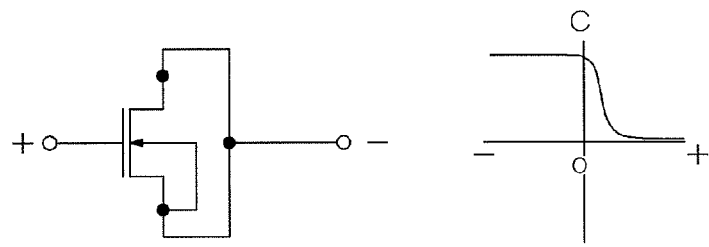
FIGS. 8A and 8B are a diagram of a structure using a MOSFET as a capacitance and a chart of capacitance characteristics.

As an example of the variable capacitance, a MOS capacitance using a MOSFET shown in FIG. 8A may be used in consideration of consistency with a standard semiconductor process. Specifically, a source and a drain of the MOSFET are short-circuited to each other to form the MOS capacitance between the short-circuited source and drain and the gate. The capacitance value of the MOS capacitance is voltage-dependent as indicated by a graph on a right side of FIG. 8B.

As an alternative to the MOS capacitance, the variable capacitance may be a variable capacitance diode, which is generally called varicap or varactor and exhibits better high frequency characteristics than the MOS capacitance. Thus, for the resonant circuit of the embodiments applied to a higher frequency circuit, the varicap is preferably used. When used for the resonator of the embodiments, the varicap's directivity needs to be considered, since such a variable capacitance element has directivity. For example, in FIG. 6A, to use the MOS capacitance as the variable capacitance element, when the potential Vp of the terminal 31 is higher than the potential Vi of the terminal 30a, it is necessary to connect a gate of the MOS capacitance to the terminal 31 and to connect a drain and a source of the MOS capacitance to the terminal 30a. Connection in a reverse direction inhibits a capacitance change with respect to the bias voltage, since the MOS capacitance operates in an accumulated condition.

As described above, while the coupling capacitance can be the variable capacitance, at least a part of the coupling capacitance may be formed by a variable capacitance. This means that the coupling capacitance Cc1 may be formed by only a variable capacitance or by a synthesized capacitance (a parallel or serial synthesized capacitance) including a variable capacitance and an additional capacitance with a substantially fixed capacitance value in the above voltage region.

In the shown example, during operation of the resonant circuit 30, the capacitance value of the variable capacitance is reduced when the bias voltage Vc applied to the MEMS resonator 10 is increased, whereas the capacitance value thereof is increased when the Vc is reduced. In other words, in the first embodiment, the Vc is obtained by Vp−Vo. Thus, when the potential Vp of the first potential terminal 31 is increased, the bias voltage Vc applied to the resonator 10 is increased, which acts to reduce the resonance frequency of the resonator 10. However, since a potential difference between terminals of the coupling capacitance Cc1 as the variable capacitance is also increased, the value of the capacitance is reduced. An amount of the change in the coupling capacitance Cc1 contributes to an increase in the resonance frequency, thereby suppressing an amount of resonance frequency change in the resonant circuit. In contrast, when the potential Vp of the terminal 31 is reduced, the bias voltage Vc is reduced, which acts to increase the resonance frequency of the resonator. However, the potential difference between the terminals of the coupling capacitance Cc1 is also reduced and thus the capacitance value is increased. Due to the capacitance change in the coupling capacitance Cc1, the resonance frequency is reduced. This can suppress the amount of the change in the resonance frequency of the resonant circuit.

Alternatively, the resonant circuit of the embodiment can be formed as follows: on the contrary to the above example, the coupling capacitance Cc1 in the first embodiment may be a variable capacitance having a voltage-dependent region in which when voltages at opposite ends of the capacitance are increased, the capacitance value is monotonously increased.

This arrangement increases an amount of the resonance frequency change with respect to an increase or decrease in the bias voltage applied to the terminal 31. Accordingly, as an advantage contrary to the primary advantage of the invention in which frequency change due to bias voltage variation is suppressed, the arrangement can be effectively used, for example, to expand an output frequency range of a voltage-controlled oscillator (VCO) that can change an oscillation frequency by a bias voltage and to enlarge a variable bandwidth when applying the resonant circuit of the embodiment to a pass band variable filter or the like in a filter circuit.

For example, in the first embodiment, the bias voltage Vc is equal to the difference value obtained by Vp−Vo. Thus, when the potential Vp of the first potential terminal 31 is increased, the resonance frequency of the resonator is expected to be reduced against an increase in the bias voltage Vc applied to the resonator. However, the potential difference between the terminals of the coupling capacitance Cc1 as the variable capacitance is also increased and thus the capacitance value is increased. The amount of the change in the coupling capacitance Cc1 also serves to reduce the resonance frequency, thereby increasing the amount of the resonant frequency change in the resonant circuit. Conversely, when the potential Vp of the terminal 3 is reduced, reduction in the bias voltage Vc acts to increase the resonance frequency of the resonator, whereas the potential difference between the terminals of the coupling capacitance Cc1 is also reduced and thereby the capacitance value is also reduced. The amount of the change in the coupling capacitance Cc1 serves to increase the resonance frequency, thus increasing the amount of the resonance frequency change in the resonant circuit.

As described above, the variable capacitance may have the voltage-dependent region in which the capacitance value is monotonously changed due to a change in the opposite-end-voltages. When the variable capacitance operates in a range of the voltage-dependent region, the voltage-dependent region of the variable capacitance may be set according to an operation condition thereof so as to have either one of the characteristics mentioned above (namely, the monotonous reduction or the monotonous increase in the capacitance value due to an increase in the opposite-end voltages). Thereby, regarding the resonance frequency change due to a bias voltage change, the amount of the resonance frequency change can be compensated or increased in accordance with a change in the capacitance value of the variable capacitance.

Figure 7A:
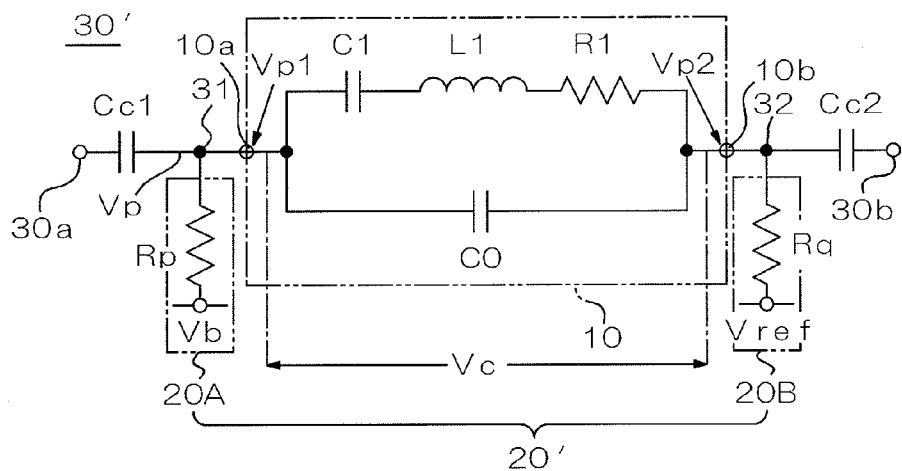
FIG. 7A is a circuit diagram showing a resonant circuit according to a second embodiment of the invention.

FIG. 7A shows a structural example of a resonant circuit according to another embodiment of the invention. In FIG. 7A, a resonant circuit 30' according to a second embodiment of the invention includes the MEMS resonator 10, the first input-output terminal 30a provided at the first terminal 10a of the MEMS resonator 10, the second input-output terminal 30b provided at the second terminal 10b of the resonator 10, the coupling capacitance Cc1 connected between the first terminal 10a of the resonator 10 and the first input-output terminal 30a of the resonant circuit, a coupling capacitance Cc2 connected between the second terminal 10b of the resonator 10 and the second input-output terminal 30b of the resonant circuit, a voltage applying unit 20A connected to the terminal 31 between the first terminal 10a of the resonator 10 and the coupling capacitance Cc1, and a voltage applying unit 20B connected to a terminal 32 between the second terminal 10b of the resonator 10 and the coupling capacitance Cc2. The voltage applying units 20A and 20B are included in a voltage applying unit 20' of the resonator circuit according to the second embodiment.

In the example shown in FIG. 7A, the voltage applying unit 20A includes the voltage source having a potential Vb and the resistance Rp, and the voltage applying unit 20B includes a voltage source having a potential Vref and a resistance Rq. A value of a DC potential voltage Vp1 of the terminal 31 is the same as that of the externally applied voltage Vb in the voltage applying unit 20A. This is because the resonator 10 galvanically acts as a capacitance element and also, the coupling capacitance Cc1 is interposed between the resonator 10 and an external circuit connected to the first input-output terminal 30a of the resonator 30'. Similarly, a DC potential voltage Vp2 of the terminal 32 has a same value as that of the externally applied voltage Vref in the voltage applying unit 20B.

The coupling capacitances Cc1 and Cc2 are each a variable capacitance having voltage dependence in which a potential difference (voltage) applied to opposite ends of the capacitance changes a capacitance value thereof.

Figure 7B:
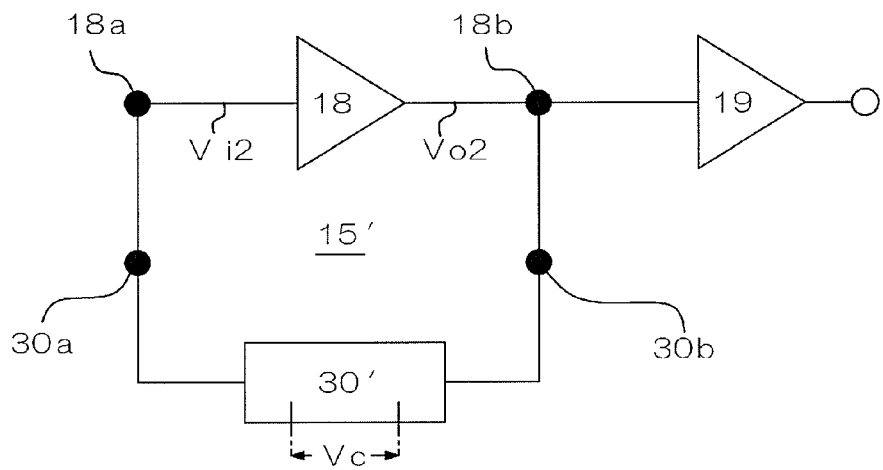
FIG. 7B is a diagram showing a structural example of an oscillation circuit.

FIG. 7B shows a structural example of an oscillation circuit 15' formed by connecting the resonant circuit 30' to other circuits. The oscillation circuit 15' includes the resonant circuit 30', an amplifier circuit 18, and an output buffer 19. In the amplifier circuit 18, a DC potential Vi2 of an input terminal 18a and a DC potential Vo2 of an output terminal 18b are each determined by a bias voltage of an active circuit element or the like to be set to a predetermined value.

In FIG. 7B, the first input-output terminal 30a of the resonant circuit 30' is at the same potential as the potential Vi2 of the input terminal 18a of the amplifier circuit 18, and the second input-output terminal 30b of the resonator circuit 30' is at the same potential as the potential Vo2 of the output terminal 18b of the amplifier circuit 18. Additionally, as shown in FIG. 7A, the first terminal 10a of the MEMS resonator 10 receives the DC potential Vp1 applied by the voltage applying unit 20A, and the second terminal 10b of the MEMS resonator 10 receives the DC potential Vp2 applied by the voltage applying unit 20B.

Consequently, a potential difference between the first and the second terminals of the MEMS resonator 10 is equivalent to a difference value between the DC potentials Vp1 and Vo2. The difference value is of a bias voltage Vc of the MEMS resonator 10. Meanwhile, a potential difference between the opposite ends of the coupling capacitance Cc1 as the variable capacitance is equivalent to a difference value between the potential Vp1 and the potential Vi2 of the terminal 30a, and the difference value is of a bias voltage of the coupling capacitance Cc1.

Additionally, a potential difference between opposite ends of the coupling capacitance Cc2 as the variable capacitance is equivalent to a difference value between the potential Vp2 and the potential Vo2 of the terminal 30b. The value is of a bias voltage of the coupling capacitance Cc2.

The second embodiment includes the coupling capacitances Cc1 and Cc2. Then, the resonance frequency $f_n$ is obtained by a following formula (4):

$$f_n = (1/2\pi) \times (L1 \times C1)^{-1/2} \times [1 + C1(Cc1+Cc2)/\{Cc1 \times Cc2 + C0(Cc1+Cc2)\}]^{1/2} \quad (4)$$

In the formula (4), when Cc1 is equal to Cc2, a following formula is obtained:

$$f_n = (1/2\pi) \times (L1 \times C1)^{-1/2} \times [1 + C1/\{0.5Cc1+C0\}]^{1/2} \quad (5)$$

Accordingly, similarly in this case, a resonance frequency obtained is higher than the resonance frequency of the MEMS resonator 10 shown by the formula (1').

The formulas (4) and (5) show that the coupling capacitances Cc1 and Cc2 are among elements for determining the resonance frequency and the resonance frequency can be controlled by changing the values of the Cc1 and Cc2.

In the present embodiment, as described above, the coupling capacitances Cc1 and Cc2 are each the voltage-dependent variable capacitance, and the capacitance values of the Cc1 and the Cc2 are controlled in accordance with the bias voltages Vp1 and Vp2 applied to the opposite ends of the MEMS resonator 10.

The coupling capacitances Cc1 and Cc2 have the characteristic in which the respective capacitance value of the Cc1 and Cc2 is reduced due to the increase in the respective bias voltages Vp1 and Vp2. The mechanical spring constant $K_m$ of the resonator 10 is reduced along with the increase in the bias voltage Vp as described above, so that the equivalent series capacitance C1 of the resonator is increased as shown in the formula (2). When this is applied to the formula (3), the increase of the capacitance C1 reduces the resonance frequency $f_n$, whereas simultaneously reducing the value of the coupling capacitances Cc1 and Cc2 can suppress an amount of shift in the resonance frequency $f_n$.

As described in the first embodiment, the variable capacitances may be a MOS capacitance or a variable capacitance diode for each. Additionally, as mentioned above, since such a variable capacitance element has directivity, it is necessary to consider the directivity of the element for use in the resonant circuit 30' of the embodiment. For example, in FIG. 7A, each variable capacitance element may be a MOS capacitance. In this case, regarding the Cc1, when the potential Vp1 of the terminal 31 is higher than the potential Vi2 of the terminal 30a, a gate of the MOS capacitance needs to be connected to the terminal 31 and a source and a drain of the MOS capacitance needs to be connected to the terminal 30a, which is the same as in the Cc2.

When one of the Vp1 and the Vp2 is lower than the potential of the terminal 30a or 30b, the variable capacitance element needs to be connected in a direction opposite to the above-described connection. In addition, to suppress a change in the resonance frequency of the resonator as the advantage of the present invention, it is necessary to use a variable capacitance having a characteristic in which the capacitance value is increased along with a voltage increase.

While the variable capacitance can be used for each coupling capacitance as described above, at least a part of the each coupling capacitance may be formed by a variable capacitance. In this case, one of the coupling capacitances Cc1 and Cc2 may be formed by only a variable capacitance or by a synthesized capacitance (a parallel or serial synthesized capacitance) including a variable capacitance and an additional capacitance with a substantially fixed capacitance value in the above voltage region. Alternatively, one of the coupling capacitances Cc1 and Cc2 may be formed by a fixed capacitance having no voltage dependence, although suppression effect on frequency change is reduced.

In the shown example, during operation of the resonant circuit 30', the capacitance value of the above variable capacitance is reduced when the bias voltage Vc applied to the MEMS resonator 10 is increased, whereas the capacitance value thereof is increased when the Vc is reduced. In other words, in the second embodiment, the Vc is obtained by Vp1−Vp2. Thus, when the potential Vp1 of the terminal 31 is increased while maintaining the potential Vp2 of the terminal 32 at a predetermined value, the bias voltage Vc applied to the resonator 10 is increased, which acts to reduce the resonance frequency of the resonator 10. However, since a potential difference between terminals of the coupling capacitance Cc1 as the variable capacitance is also increased, the value of the capacitance is reduced. An amount of the change in the coupling capacitance Cc1 contributes to an increase in the resonance frequency, thereby suppressing an amount of resonance frequency change in the resonant circuit. In contrast, when the potential Vp of the terminal 31 is reduced, the bias voltage Vc is reduced, whereby the resonance frequency of the resonator is expected to be increased. However, the potential difference between the terminals of the coupling capacitance Cc1 is also reduced and thus the capacitance value is increased. The capacitance change in the coupling capacitance Cc1 serves to reduce the resonance frequency, thereby suppressing the amount of the resonance frequency change in the resonant circuit.

On the other hand, in the example, when the potential Vp1 of the terminal 31 is increased and the potential Vp2 of the terminal 32 is increased by a smaller percentage than the increase in the Vp1, the resonance frequency of the resonator is expected to be reduced against the increase in the bias voltage Vc applied to the resonator. However, the potential difference between the terminals of each of the coupling capacitance Cc1 and Cc2 as the variable capacitances is also increased and thus capacitance values of the Cc1 and the Cc2 are reduced. The amounts of the changes in the coupling capacitances Cc1 and Cc2 serve to increase the resonance frequency of the resonant circuit, thereby enabling the amount of the resonance frequency change to be suppressed. Furthermore, even when the potentials Vp1 and Vp2 of the terminals 31 and 32 are reduced, the same advantageous effect can be obtained that can suppress the amount of change in the resonance frequency of the resonant circuit.

Additionally, in the second embodiment, on the contrary to the above example, one of the coupling capacitances Cc1 and Cc2 may be a variable capacitance having a voltage-dependent region in which the capacitance value is monotonously increased as the opposite-end voltages are increased. This provides the same operation as in the first embodiment.

As described above, one of the variable capacitances may have the voltage-dependent region in which the capacitance value is monotonously changed due to a change in the opposite-end-voltages. When the variable capacitance operates in the range of the voltage-dependent region, the voltage-dependent region of the variable capacitance may be set according to an operation condition thereof so as to have either one of the characteristics mentioned above (namely, the monotonous reduction or the monotonous increase in the capacitance value due to an increase in the opposite-end voltages). Thereby, regarding the resonance frequency change due to a bias voltage change, the amount of the resonance frequency change can be reduced or increased in accordance with a change in the capacitance value of the variable capacitance.

The capacitance value of the each coupling capacitance and a capacitance change rate of each variable capacitance forming the at least a part of the coupling capacitance are preferably determined appropriately in accordance with a range of the opposite-end voltages based on an actually required resonance frequency and a bias voltage value. The capacitance value and the capacitance change rate may be adjusted by setting a structure of the variable capacitance according to need or by appropriately setting a relationship between a bias voltage applied to the MEMS resonator 10 and the opposite-end voltages of the variable capacitance. In any case, the capacitance value and the capacitance change rate are set so as to allow control of resonance frequency change in each of the resonant circuits 30 and 30' caused by bias voltage change. For example, the relationship between the bias voltage and the opposite-end voltage of the variable capacitance may be changed as follows: when at least one of the coupling capacitances Cc1 and Cc2 is formed by a synthesized capacitance including a variable capacitance and an other capacitance connected to in series or/and parallel to the variable capacitance, a connecting manner and a number of connections between the variable capacitance and the other capacitance may be changed.

Figure 9:
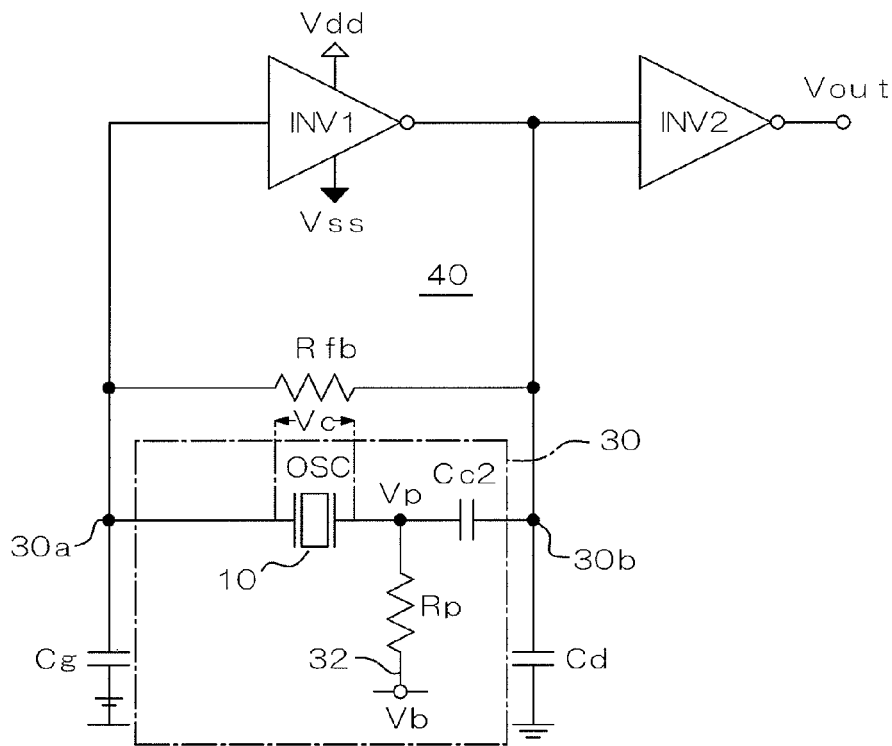
FIG. 9 is a circuit diagram showing a structure of an electronic circuit (an oscillation circuit) of Example 1.

FIG. 9 is a schematic diagram of a circuit structure of an electronic circuit as Example 1. The electronic circuit includes the resonant circuit 30 of the first embodiment and a signal circuit 40 connected to the resonant circuit 30. FIG. 9 shows an example of an oscillation circuit using the resonant circuit 30 of the first embodiment. In the resonant circuit 30 shown in the example, on the contrary to the first embodiment, a terminal 32 and the coupling capacitance Cc2 are connected to only the second terminal 10b of the MEMS resonator 10. However, the circuit structure is substantially equivalent to that shown in FIG. 6A.

In Example 1, the input-output terminals 30a and 30b of the resonant circuit 30 are connected to the signal circuit 40. The signal circuit 40 includes an amplifier circuit INV1 having negative resistance and connected parallel to the resonant circuit 30 and a feedback resistance Rfb connected parallel to the resonant circuit 30. Opposite ends of the amplifier circuit INV1, the feedback resistance Rfb, and the resonant circuit 30 are connected to constant potentials (grounded potentials) via capacitances Cg and Cd. The parallel circuits are connected to an amplifier circuit INV2, which outputs an output potential Vout.

Figure 10:
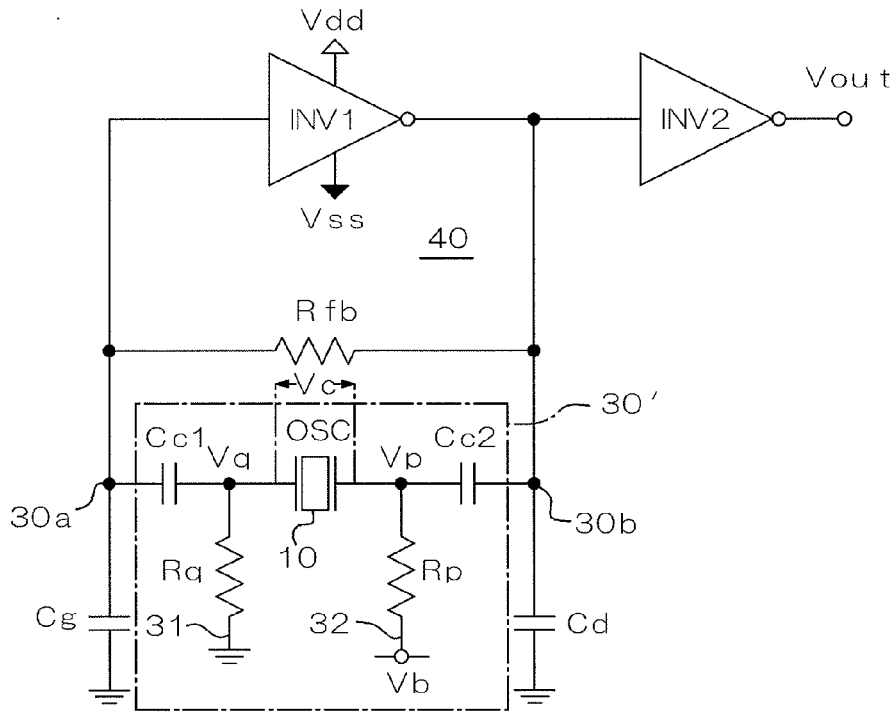
FIG. 10 is a circuit diagram showing a structure of an electronic circuit (an oscillation circuit) of Example 2.

FIG. 10 is a schematic diagram showing a circuit structure of an electronic circuit as Example 2. The electronic circuit of Example 2 is an oscillation circuit including the resonant circuit 30' of the second embodiment and the signal circuit 40. Parts other than the resonant circuit 30' are the same as in Example 1 of FIG. 9. In Example 2 including the resonant circuit 30', terminals 31, 32, respectively, of the bias circuit 20' and the coupling capacitances Cc1, Cc2, respectively, are provided on opposite sides of the MEMS resonator 10. This can further ensure setting of the bias voltage of the MEMS resonator 10. A potential supplied by each of the terminals 31 and 32 is arbitrarily set. For example, as in the present example, the first potential Vp is supplied by one of the terminals 31, 32 and the second potential Vq supplied by the other one thereof is set to a grounded potential, whereby the bias voltage Vc (which is equal to Vp) can be applied. Alternatively, when a first potential +Vp/2 is supplied to one of the terminals 31, 32 and a second potential −Vp/2 is supplied to the other one thereof, the same bias voltage Vc (=Vp) can be applied.

Figure 11:
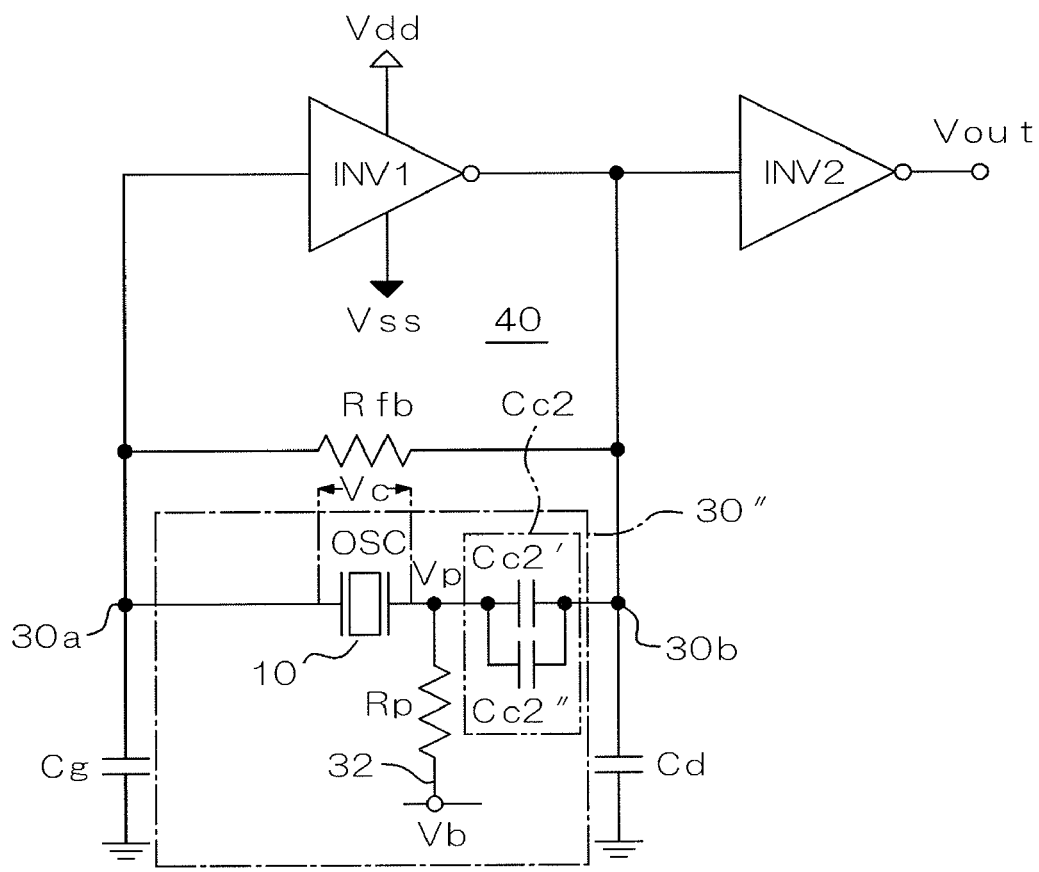
FIG. 11 is a circuit diagram showing a structure of an electronic circuit (an oscillation circuit) of Example 3.

FIG. 11 is a schematic diagram showing a circuit structure of an electronic circuit as Example 3. Similarly in this example, parts other than a resonant circuit 30" are the same as in each of Examples of FIGS. 9 and 10. Example 3 is the same as Example 1 of FIG. 9 in that the resonant circuit 30" includes the terminal 32 supplying the first potential Vp in the bias circuit and the coupling capacitance Cc2, and is different from Example 1 in that the coupling capacitance Cc2 is a synthesized capacitance obtained by connecting a variable capacitance Cc2' and an additional capacitance Cc2" in parallel to each other. Thus, the coupling capacitance can be formed by connecting the variable capacitance parallel to the other capacitance. In this case, the capacitance value of the coupling capacitance Cc2 is equivalent to a sum of capacitance values of the variable capacitance Cc2' and the additional capacitance Cc2". Accordingly, by changing a contribution percentage of the variable capacitance Cc2' in the coupling capacitance Cc2 while maintaining the capacitance value of the coupling capacitance Cc2 at a large level to some extent, a degree of influence of the variable capacitance Cc2' on the resonance frequency of the resonant circuit 30" can be adjusted.

FIGS. 12A-1 and 12A-2 are illustrations showing a basic structure of a ladder-type filter circuit and frequency band characteristics of the filter circuit, and FIG. 12B is a circuit diagram showing a structure of the filter circuit as an electronic circuit of Example 4. The electronic circuit of Example 4 is also an example including the resonant circuit 30 of the first embodiment. The example shows a filter circuit 50 including the resonant circuit 30 of the first embodiment. In the example, each of series resonators Rs is connected in series between an input terminal 50a and an output terminal 50b of the filter circuit 50, as well as each of parallel resonators Rp is connected between a point between the input and the output terminals 50a, 50b and each of constant potentials (grounded potentials). The resonant circuit 30 is used as the each series resonator Rs and the each parallel resonator Rp.

As shown in FIG. 12A-1, in the ladder-type filter circuit, the series resonator Rs and the parallel resonator Rp forms a band pass filter. In general, regarding a resonance frequency Fsr and an anti-resonance frequency Fsa of the series resonator Rs and a resonance frequency Fpr and an anti-resonance frequency Fpa of the parallel resonator Rp, band transmission characteristics can be obtained by slightly shifting (usually, a few percent) the resonance frequencies Fsr and Fpr. In a characteristic graph of FIG. 12A-2, a signal transmission rate is a maximum when the resonance frequency Fsr of the series resonator Rs is equal to the anti-resonance frequency Fpa of the parallel resonator Rp, where a lower limit of the transmission band is equivalent to the resonance frequency Fpr of the parallel resonator Rp and an upper limit thereof is equivalent to the anti-resonance frequency Fsa of the series resonator Rs. In this structure, the resonance frequency of each resonator needs to be set with high precision, so that the structure of the filter circuit as Example 4 is significantly effective.

Regarding the electronic circuit of Example 4, for example, as shown in FIG. 12B, the series resonators Rs are connected in series between the input and the output terminals 50a and 50b of the filter circuit 50, and each parallel resonator Rp is connected between each point before or after the each series resonator Rs and each grounded potential as a constant potential. In this manner, when the series resonators Rs and the parallel resonators Rp are connected in a ladder configuration, there can be obtained a filter circuit with a desirable frequency band by adjusting the resonance frequencies of the respective resonators to appropriately different values among the resonators.

The present Example basically includes the coupling capacitance of Example 1 formed by the synthesized capacitance. However, instead of that, the coupling capacitances of Example 2 may be used as a synthesized capacitance. In addition, as the synthesized capacitance, the plurality of capacitances may be connected in parallel to each other as mentioned above or may be connected in series. For example, when each coupling capacitance is a diode having the MIS structure or the MOS structure described above, a depletion layer in a semiconductor and an insulating layer (an oxide film) both serve as a dielectric. Thus, this may be substantially regarded as a circuit structure including a variable capacitance and an additional capacitance connected in series. In the case, opposite-end voltages applied to the variable capacitance as at least one of the capacitances are reduced in accordance with a connection manner. Thus, if a voltage region where the variable capacitance can be used is specifically restricted, the circuit structure may be designed such that the variable capacitance is used in a range of the voltage region. Furthermore, alternatively, the coupling capacitance may be formed by a circuit structure including a plurality of capacitances connected in series and/or parallel to each other.

Now, the first embodiment of FIG. 6A will be discussed again. In the first embodiment, the formula (3) for the resonance frequency can be rewritten as in a following formula (6):

$$f_n = (1/2\pi) \times L1^{-1/2} \times \{1/C1 + 1/(C0 + Cc1)\}^{1/2} \qquad (6)$$

In the formula (6), it can be found that the resonance frequency is influenced by a reciprocal of the equivalent series capacitance C1 and a reciprocal of a sum of the equivalent parallel capacitance C0 and the coupling capacitance Cc1, at a same weight between the reciprocals. Accordingly, while the resonance frequency $f_n$ depends on a relationship between a change rate of the equivalent series capacitance C1 and a change rate of the coupling capacitance Cc1 due to bias voltage change, if the change rates are not extremely different, it is obvious that the resonance frequency change in the first embodiment can be maximally suppressed when the C1 is approximately equal to the sum of the C0 and the Cc1.

However, in the embodiment, it is not necessarily required that the variable capacitance should be set to achieve elimination of resonance frequency change in the MEMS resonator 10 caused by bias voltage change. Suppressing the resonance frequency change is enough and there is no need for precise setting of each capacitance value as above. In fact, the equivalent series capacitance C1 and the equivalent parallel capacitance C0 depend on the structure of the MEMS resonator 10 and thus cannot be controlled independently. Therefore, the coupling capacitance is set so as to operate in a range of 1/10 to 10 times the equivalent series capacitance C1, thereby increasing the suppression effect of the coupling capacitance on the resonance frequency change.

For a common structural size of the MEMS resonator 10, the equivalent series capacitance C1, the equivalent parallel capacitance C0, and the equivalent inductance L1, respectively, may be set in a range of approximately $10^{-12}$ to $10^{-17}$ F, approximately $10^{-12}$ to $10^{-4}$ F, and approximately $10^{0}$ to $10^{-5}$ H, respectively. For example, if the coupling capacitance Cc1 (formed as a variable capacitance) has a capacitance value of approximately $10^{-12}$ F as a minimum required value for the coupling capacitance, setting the equivalent series capacitance C1 and the equivalent parallel capacitance C0 in the range of approximately $10^{-12}$ to $10^{-14}$ F enables the resonance frequency change to be sufficiently suppressed. Particularly, by designing the structure of the MEMS resonator 10 such that the value of the equivalent series capacitance C1 has a same order as in the equivalent parallel capacitance C0, the resonance frequency change caused by bias voltage change can be suppressed to some extent while maintaining the capacitance value of the coupling capacitance Cc1 in a minimum required range.

In the resonant circuit of the embodiment and in the electronic circuit including the resonant circuit, using the variable capacitance allows control of the state of resonance frequency change in the resonator 10 caused by a change in the bias voltage Vc, so that resonance characteristics can be stabilized and a variable range of resonance frequency can be increased. In addition, since the state of resonance frequency change due to bias voltage is controlled, adjustment precision of resonance frequency can be improved and a range of the adjustment can be increased when adjusting the resonance frequency by using a bias voltage. This allows formation of a high-quality resonant circuit.

Figure 13:
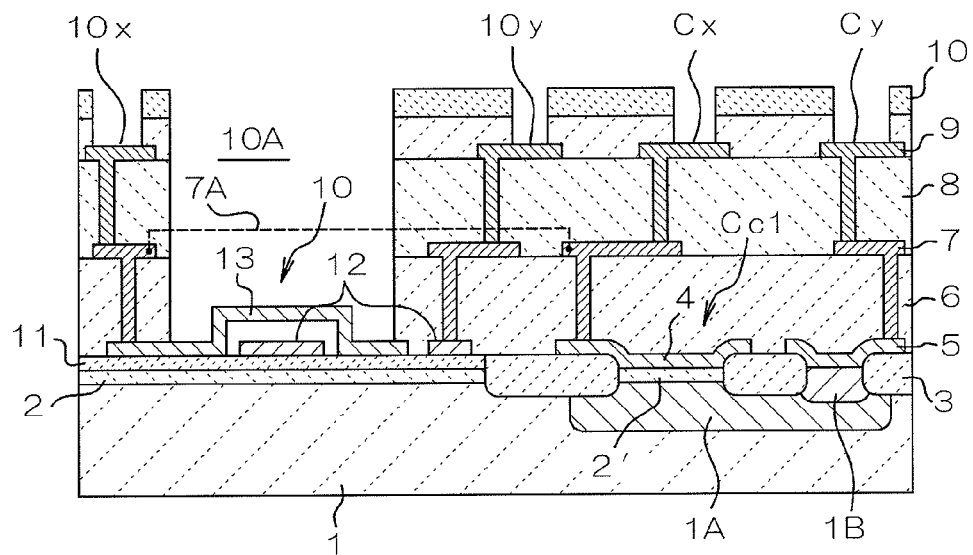
FIG. 13 is a longitudinal sectional view showing a specific structural example of an electronic circuit or an electronic device achieving miniaturization and production cost reduction.

Preferably, the MEMS resonator 10 of the embodiment, the coupling capacitances Cc1, Cc2, and the signal circuit 40 are above the same substrate. Thereby, for example, there can be obtained a compact electronic circuit or a compact electronic device including the electronic circuit, or production cost can be reduced. FIG. 13 shows a structural example thus formed. FIG. 13 is a schematic longitudinal sectional view of a structure including the MEMS resonator 10 and the coupling capacitance Cc1 formed above a semiconductor substrate. On the substrate 1 made of a semiconductor material such as silicon is formed the insulating film 2, on which the MEMS resonator 10 is formed as described above. Meanwhile, on a surface portion of the substrate 1 is formed a conductive region 1A (which is, for example, an n-type impurity region if the substrate 1 is of p-type), and around the conductive region 1A is formed an element separating film 3 made of an insulating material such as silicon oxide. On the conductive region 1A is formed an insulating film 2', so that the conductive region 1A is opposed to a capacitance electrode 4 formed above the substrate 1 via the insulating film 2'. The capacitance electrode 4 can be formed by an arbitrary process using an arbitrary conductive material, but preferably is formed by the same process using the same material as in the fixed electrode 12 (a lower conductive layer) of the MEMS resonator 10.

At a part of a surface of the conductive region 1A is formed a low-resistance region 1B having an increased impurity concentration (a region with a highly-concentrated n-type dopant in the above example). The low-resistance region 1B is conductively connected to a connection electrode 5 above the substrate 1. The connection electrode 5 can also be formed by an arbitrary process using an arbitrary material, but preferably is formed by the same process using the same material as in the fixed electrode 12 (the lower conductive layer) of the MEMS resonator 10. As a result, the conductive region 1A, the insulating film 2', the capacitance electrode 4, and the connection electrode 5 form a MOS capacitance, which is used as the coupling capacitance Cc1.

Additionally, interlayer insulating films 6 and 8 made of silicon oxide or the like and wiring layers 7 and 9, respectively, are alternately formed above the substrate 1. The wiring layers 7 and 9 are provided to establish connections between the MEMS resonator 10, the coupling capacitance Cc1, and a not-shown signal circuit (having a CMOS structure or the like provided on a not-shown surface portion of the substrate 1). Thereby, there can be obtained an integrated electronic device as described above. In the structure of the above embodiment, for example, a wiring portion 7A (indicated by a broken line in FIG. 13) of the wiring layer 7 is used to conductively connect the movable electrode 13 of the MEMS resonator 10 to the coupling capacitance Cc1. Meanwhile, in the example of the drawing, the terminals respective parts corresponding to 10a, 10b of the MEMS resonator 10 and the opposite ends of the coupling capacitance Cc1 are formed as respective connection pads 10x, 10y, Cx, and Cy such that the parts can be connected to an external circuit or the like. For example, the connection pad 10x corresponds to the terminal 31. However, this is merely a structural example, and any unnecessary connection pad can be omitted. In addition, as a top layer, there is formed a protective film 10 having a dual-layer structure with a silicon oxide layer and a silicon nitride layer.

The MEMS resonator 10 is placed in a containing space 10A surrounded by a laminated structure including the interlayer insulating films 6, 8, the wiring layers 7,9, and the protective film 10 provided above the substrate 1. The containing space 10A is used to allow operation of the MEMS resonator 10. Pressure inside the space may be reduced or the space may be sealed according to need. For example, the containing space 10A is formed at a release step of removing the interlayer insulating films 6,8 and the protective film 10 by using hydrofluoric acid (HF) etching after formation of those films.

As described hereinabove, using the integrated-circuit technology (the semiconductor manufacturing technology), the MEMS resonator 10, the coupling capacitance Cc1, and the signal circuit are integrated above the same substrate 1, thereby achieving miniaturization of electronic circuits and electronic devices and facilitating production thereof.

Figure 14:
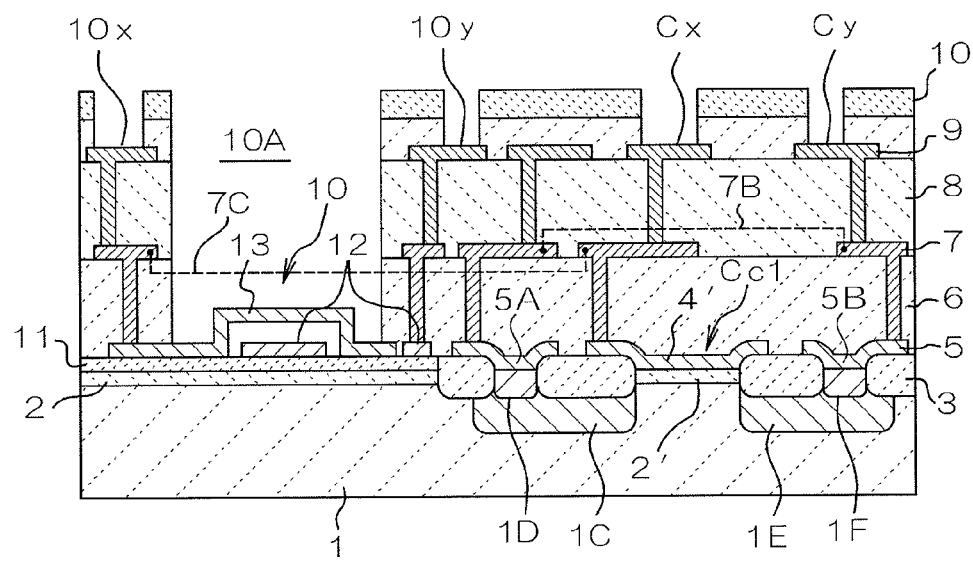
FIG. 14 is a longitudinal sectional view showing another specific structural example of the electronic circuit or the electronic device.
Figure 15A:
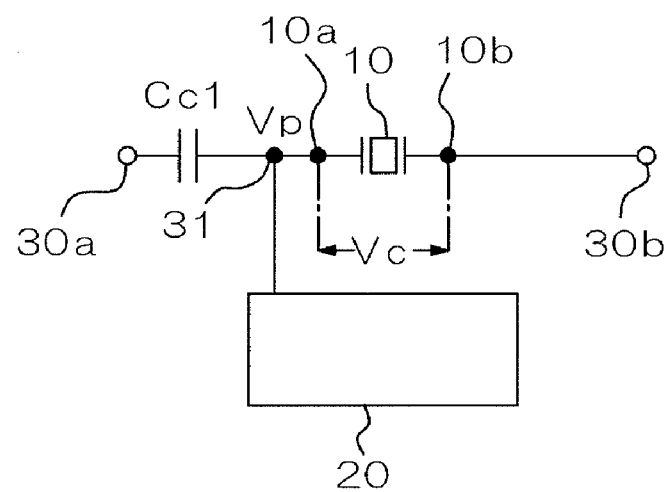
FIGS. 15A and 15B are schematic diagrams showing structural examples of the resonant circuits according to the embodiments.
Figure 15B:
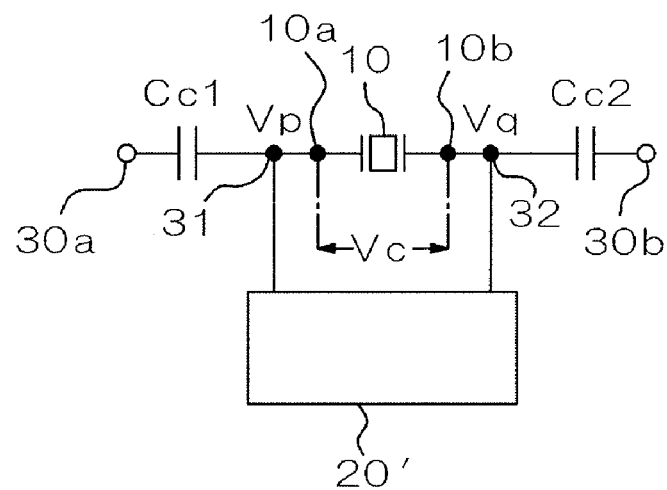

FIG. 14 is a structural example including the MEMS resonator 10 and the coupling capacitance Cc1 in another electronic circuit or electronic device. Structural parts other than those shown in the drawing are the same as in the example of FIG. 13. In the example of FIG. 14, same parts as those in FIG. 13 are denoted by same reference characters and numerals and explanations thereof will be omitted.

In the structural example of FIG. 14, conductive regions 1C and 1E are formed on the surface portion of the substrate 1, and a gate insulating film 2' is provided between the regions 1C and 1E. On the gate insulating film 2' is formed a gate electrode 4'. The conductive region 1C is conductively connected to a source electrode 5A above the substrate 1 via a low-resistance region 1D, and the conductive region 1E is conductively connected to a drain region 5B above the substrate 1 via a low-resistance region 1F. The structure of the elements forms a MOSFET (a MOS transistor). In the embodiment, the source and the drain are short-circuited by a wire section 7B to form a MOS capacitance between the gate electrode 4' and the source and the drain. The MOS capacitance is used as the coupling capacitance Cc1. Additionally, the resonator 10 is conductively connected to the coupling capacitance Cc1 by a wiring layer 7C.

In each of the structural examples shown above, the same transistor structure as the MOSFET forming the MOS capacitance in FIG. 14 can provide a signal circuit including an amplifier circuit and the like (a CMOS structure).

Examples of the electronic circuit or the electronic device including the resonator of each of the embodiments and the signal circuit connected to the resonant circuit include various circuit structures such as transmission/reception circuits, in addition to the oscillation circuit with the signal circuit 40 as shown in each of the embodiments and Examples above and filter circuits such as the filter circuit 50. Particularly, there can be formed various kinds of electronic devices, such as those including an oscillation circuit and a filter circuit. Furthermore, a resonant circuit including a MEMS resonator and a bias circuit, a signal circuit, an electronic circuit, and the like, or combinations of a plurality of the respective elements can be provided above a same substrate.

The resonant circuit, the oscillation circuit, the filter circuit, and the electronic device according to the embodiments of the invention are not restricted to those described with reference to the drawings shown above. It should be obvious that various modifications and alterations may be made without departing the scope of the invention. For example, the resonant circuit of each of the embodiments may include circuit elements that have no influence on substantial and essential operation.

The entire disclosure of Japanese Patent Application Nos. 2008-158846, filed Jun. 18, 2008 and 2009-073813, filed Mar. 25, 2009 are expressly incorporated by reference herein.

What is claimed is:
1. A resonant circuit, comprising:
a substrate;
a MEMS resonator including a fixed electrode and a movable electrode formed above the substrate and having a first terminal and a second terminal, the movable electrode having a movable portion opposing at least a part of the fixed electrode;
a first input-output terminal connected to the first terminal connected to one of the fixed electrode and the movable electrode of the MEMS resonator;
a second input-output terminal connected to the second terminal connected to an other one of the fixed electrode and the movable electrode of the MEMS resonator;
a voltage applying unit supplying a potential to at least the first terminal to apply a bias voltage between the first and the second terminals; and
a variable capacitance connected between the first terminal and the first input-output terminal to allow a capacitance value to be changed by a change in a potential difference between opposite ends of the variable capacitance;
wherein the variable capacitance is characterized by at least partially having a voltage-dependent region where the change in the potential difference between the opposite ends of the variable capacitance causes the capacitance value to change monotonously and an increase in the bias voltage causes the capacitance value to be reduced monotonously.

2. The resonant circuit according to claim 1, wherein the voltage applying unit supplies a first potential to the first terminal, whereas the second terminal is set at a grounded potential.

3. The resonant circuit according to claim 1, wherein the voltage applying unit supplies a first potential and a second potential, respectively, to the first terminal and the second terminal, respectively.

4. The resonant circuit according to claim 1 further including an additional capacitance connected in parallel to the variable capacitance.

5. An oscillation circuit including the resonant circuit of claim 1 and an external circuit having an amplifier circuit connected to the resonant circuit.

6. The oscillation circuit according to claim 5, wherein the MEMS resonator, the voltage applying unit, the variable capacitance, and the amplifier circuit are provided above the same substrate.

7. A filter circuit including the resonant circuit of claim 1.

8. The filter circuit according to claim 7, wherein the MEMS resonator, the voltage applying unit, and the variable capacitance are provided above the same substrate.

9. An electronic device including the resonant circuit of claim 1.

10. The resonant circuit according to claim 1, wherein the MEMS resonator, the voltage applying unit, and the variable capacitance are provided above the same substrate.

11. An electronic device wherein an oscillation circuit including the resonant circuit of claim 1 and an external circuit having an amplifier circuit connected to the resonant circuit and a filter circuit including the resonant circuit of claim 1 are provided above the same substrate.

12. A resonant circuit, comprising:
a substrate;
a MEMS resonator including a fixed electrode and a movable electrode formed above the substrate and having a first terminal and a second terminal, the movable electrode having a movable portion opposing at least a part of the fixed electrode;
a first input-output terminal connected to the first terminal connected to one of the fixed electrode and the movable electrode of the MEMS resonator;
a second input-output terminal connected to the second terminal connected to an other one of the fixed electrode and the movable electrode of the MEMS resonator;
a voltage applying unit supplying a potential to the first terminal to apply a bias voltage between the first and the second terminals, the bias voltage increasing as the potential supplied to the first terminal is increased; and
a variable capacitance connected between the first terminal and the first input-output terminal to allow a capacitance value to be reduced by an increase in the potential supplied to the first terminal.

* * * * *